(12) United States Patent
Heck et al.

(10) Patent No.: US 10,466,515 B2
(45) Date of Patent: Nov. 5, 2019

(54) ON-CHIP OPTICAL ISOLATOR

(71) Applicant: Intel Corporation, Santa Clara, CA (US)

(72) Inventors: John Heck, Berkeley, CA (US); David N. Hutchison, Santa Clara, CA (US); Jie Sun, Mountain View, CA (US); Haisheng Rong, Pleasanton, CA (US); Woosung Kim, Mountain View, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/071,105

(22) Filed: Mar. 15, 2016

(65) Prior Publication Data

US 2017/0269395 A1    Sep. 21, 2017

(51) Int. Cl.
*G02B 6/13* (2006.01)
*G02B 6/12* (2006.01)
(Continued)

(52) U.S. Cl.
CPC ........ *G02F 1/0955* (2013.01); *G02B 6/12004* (2013.01); *G02B 6/131* (2013.01);
(Continued)

(58) Field of Classification Search
CPC .... G02B 6/131; G02B 6/12004; G02B 6/132; G02B 6/2766; G02B 6/29352;
(Continued)

(56) References Cited

U.S. PATENT DOCUMENTS 5,657,151 A   8/1997  Swan et al.
6,141,140 A   10/2000 Kim
(Continued)

FOREIGN PATENT DOCUMENTS

JP    11246296 A  *  9/1999
WO    WO2012125368 A1   9/2012

OTHER PUBLICATIONS

Stadler et al., Integrated Magneto-Optical Materials and Isolators: A review Feb. 2014, IEEE Photonics Journal, vol. 6, No. 1.*
(Continued)

*Primary Examiner* — Ryan A Lepisto
*Assistant Examiner* — Erin D Chiem
(74) *Attorney, Agent, or Firm* — Schwabe, Williamson & Wyatt, P.C.

(57) ABSTRACT

Embodiments herein relate to photonic integrated circuits with an on-chip optical isolator. A photonic transmitter chip may include a laser and an on-chip isolator optically coupled with the laser that includes an optical waveguide having a section coupled with a magneto-optic liquid phase epitaxy grown garnet film. In some embodiments, a cladding may be coupled with the garnet film, the on-chip isolator may be arranged in a Mach-Zehnder interferometer configuration, the waveguide may include one or more polarization rotators, and/or the garnet film may be formed of a material from a rare-earth garnet family. Other embodiments may be described and/or claimed.

14 Claims, 7 Drawing Sheets

(51) Int. Cl.
  *G02B 6/27*  (2006.01)
  *G02B 6/293*  (2006.01)
  *G02F 1/095*  (2006.01)
  *H01S 5/00*  (2006.01)
  *G02B 6/132*  (2006.01)
  *G02F 1/00*  (2006.01)

(52) U.S. Cl.
  CPC ........... *G02B 6/132* (2013.01); *G02F 1/0036* (2013.01); *H01S 5/0064* (2013.01); *G02B 6/2766* (2013.01); *G02B 6/29352* (2013.01); *G02B 2006/1208* (2013.01); *G02B 2006/1215* (2013.01); *G02B 2006/12038* (2013.01); *G02B 2006/12061* (2013.01); *G02B 2006/12078* (2013.01); *G02B 2006/12121* (2013.01); *G02B 2006/12157* (2013.01)

(58) Field of Classification Search
  CPC ........... G02B 2006/12157; G02B 2006/12061; G02B 2006/12078; G02B 2006/1215; G02B 2006/1208; G02B 2006/12121; G02B 2006/12038; G02F 1/0955; H01S 5/0064
  See application file for complete search history.

(56) References Cited

U.S. PATENT DOCUMENTS

| | | | |
|---|---|---|---|
| 6,542,647 | B2 | 4/2003 | Minemoto et al. |
| 6,927,909 | B2 | 8/2005 | Minemoto |
| 7,006,289 | B2 | 2/2006 | Ross et al. |
| 7,133,579 | B2 | 11/2006 | Elezzabi et al. |
| 7,224,854 | B2 | 5/2007 | Ellwood, Jr. |
| 7,254,287 | B2 | 8/2007 | Ellwood, Jr. |
| 7,916,982 | B1 | 3/2011 | Bahuguna et al. |
| 8,306,371 | B2 | 11/2012 | Yokoi |
| 8,335,407 | B2 | 12/2012 | Yokoi |
| 9,274,279 | B1 | 3/2016 | Roth et al. |
| 9,934,800 | B1* | 4/2018 | Neira .................. G11B 5/6088 |
| 2005/0169582 | A1 | 8/2005 | Tan et al. |
| 2005/0196103 | A1 | 9/2005 | Kaplan |
| 2006/0103380 | A1 | 5/2006 | Kochergin et al. |
| 2006/0214866 | A1 | 9/2006 | Araki et al. |
| 2006/0227331 | A1 | 10/2006 | Vollmer et al. |
| 2008/0267557 | A1 | 10/2008 | Wang et al. |
| 2009/0136191 | A1 | 5/2009 | Bi et al. |
| 2009/0142019 | A1 | 6/2009 | Popovic |
| 2010/0080504 | A1 | 4/2010 | Shetrit et al. |
| 2010/0158430 | A1* | 6/2010 | Nakada .................. G02B 6/132 385/6 |
| 2010/0238536 | A1 | 9/2010 | Hu et al. |
| 2012/0002914 | A1 | 1/2012 | Kroemer et al. |
| 2012/0189246 | A1 | 7/2012 | Hofrichter et al. |
| 2012/0093454 | A1 | 8/2012 | Filgas |
| 2013/0170785 | A1 | 7/2013 | Gao |
| 2013/0251299 | A1 | 9/2013 | He et al. |
| 2014/0270629 | A1 | 9/2014 | Dutt et al. |
| 2014/0334764 | A1 | 11/2014 | Galland et al. |
| 2015/0097210 | A1 | 4/2015 | Krasulick et al. |
| 2015/0219935 | A1 | 8/2015 | Guzzon et al. |
| 2015/0261058 | A1 | 9/2015 | Silverstone et al. |
| 2016/0049767 | A1* | 2/2016 | Morton .................. H01S 3/083 372/20 |
| 2016/0062063 | A1 | 3/2016 | Ogura et al. |
| 2017/0059774 | A1 | 3/2017 | Baudot |
| 2017/0198402 | A1 | 7/2017 | Takeuchi |
| 2017/0199402 | A1* | 7/2017 | Sun ....................... G02F 1/0955 |

OTHER PUBLICATIONS

Levy, M., The On-Chip Integration of Magnetooptic Waveguide Isolators, Nov./Dec. 2002, IEEE Journal of Selected Topics in Quantum Electronics, vol. 8, No. 6, pp. 1300-1306.*

Bi et al., "On-chip optical isolation in monolithically integrated non-reciprocal optical resonators," Nature Photonics, vol. 5, Dec. 2011, pp. 758-762.
Agarwal et al., "Wavelength Locking of a Si Photonic Ring Transmitter using a Dithering-based OMA Stabilizing Feedback Loop," Optical Society of America, (2016), 3 pages.
Sun et al., "A Monolithically-Integrated Chip-to-Chip Optical Link in Bulk CMOS," IEEE Journal of Solid-State Circuits, vol. 50, No. 4, Apr. 2015, pp. 828-844.
Dai et al., "Passive technologies for future large-scale photonic integrated circuits on silicon: polarization handling, light non-reciprocity and loss reduction," Light: Science & Applications, (2012), 12 pages.
Hendry et al., "Time-division-multiplexed arbitration in silicon nanophotonic networks-on-chip for high-performance chip multi-processors," J. Parallel Distrib. Comput. 71(5), (2011), pp. 641-650.
Tien et al., "Silicon ring isolators with bonded nonreciprocal magneto-optic garnets," Optics Express, vol. 19, No. 12, Jun. 6, 2011, pp. 11740-11745.
Shoji et al., "Optical nonreciprocal devices based on magneto-optical phase shift in silicon photonics," Journal of Optics 18.1, (2015), 15 pages.
Reed et al., "Silicon optical modulators." Nature Photonics, vol. 4, Aug. 2010, pp. 518-526.
Heck et al., "Integrated Microwave Photonic Isolators: Theory, Experimental Realization and Application in a Unidirectional Ring Mode-Locked Laser Diode," Photonics, vol. 2, (2015), 1pp. 2 957-2 968.
Ghosh et al., "Compact Mach—Zehnder Interferometer Ce: YIG/SOI Optical Isolators." Photonics Technology Letters, vol. 24, No. 18, Sep. 15, 2012, pp. 1653-1656.
Gardes et al., "40 Gb/s silicon photonics modulator for TE and TM polarisations," Optics Express, vol. 19, No. 12, Jun. 6, 2011, pp. 11804-11814.
Cardenas et al., "Low loss etchless silicon photonic waveguides," Optics Express, vol. 17, No. 6, Mar. 16, 2009, pp. 4752-4757.
Dai et al., "Polarization management for silicon photonic integrated circuits," Laser Photonics Rev., (2013), 26 pages.
Galland et al. "Broadband on-chip optical non-reciprocity using phase modulators." Optics Express, vol. 21, No. 12, Jun. 17, 2013, pp. 14500-14511.
Tzuang et al., "Non-reciprocal phase shift induced by an effective magnetic flux for light." Nature Photonics, Jun. 23, 2014, 11 pages.
Shintaku et al., "Preparation of Ce-Substituted Yttrium Iron Garnet Films for Magneto-Optic Waveguide Devices", Japanese Journal of Applied Physics, vol. 35, Jul. 3, 1996, pp. 4689-4691.
Shoji et al., "Silicon Mach—Zehnder interferometer optical isolator having 8 nm bandwidth for over 20 dB isolation", Japanese Journal of Applied Physics, vol. 53, Jan. 24, 2014, 4 pages.
Ghosh, Samir, "Optical isolators in silicon based photonic integrated circuits", PhD Thesis, Ghent University, (2013), 203 pages.
Ghosh et al., "Ce:YIG/Silicon-on-Insulator waveguide optical isolator realized by adhesive bonding", Optics Express, vol. 20, No. 2, Jan. 16, 2012, pp. 1839-1848.
Notice of Allowance dated Sep. 25, 2017 for U.S. Appl. No. 15/221,436, 26 pages.
International Search Report and Written Opinion dated Aug. 25, 2017 for International Application No. PCT/US2017/039303, 11 pages.
International Search Report and Written Opinion dated Apr. 20, 2017 for International Application No. PCT/US2017/016733, 12 pages.
Espinola et al., "Magneto-optical nonreciprocal phase shift in garnet/silicon-on-insulator waveguides," Optics Letters, vol. 29, No. 9, May 1, 2004, 3 pages.
Non-Final Office Action dated Apr. 24, 2018 for U.S. Appl. No. 15/250,745, 48 pages.
Final Office Action dated Nov. 29, 2018 for U.S. Appl. No. 15/250,745, 22 pages.
International Search Report and Written Opinion dated Nov. 8, 2017 for International Application No. PCT/US2017/044386, 13 pages.

* cited by examiner

ON-CHIP OPTICAL ISOLATOR

FIELD

Embodiments of the present disclosure generally relate to the field of optoelectronics and, more particularly, to photonic integrated circuits with on-chip optical isolators such as silicon photonics transmission circuits fabricated on silicon-on-insulator (SOI) wafers.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Silicon photonics is often considered to be one of the most popular and successful technology platforms based on planar photonics circuits for cost effective optoelectronics integration. Optical waveguide-based photonics devices such as lasers, modulators, and detectors are typically fabricated on silicon-on-insulator (SOI) wafers. In SOI photonic systems, light is typically confined in a wafer (or chip) plane. Silicon waveguides are typically designed with sub-micron cross-sections, allowing dense integration of active and passive devices to achieve higher speed and lower driving power. Light transmitted from silicon SOI photonic systems is typically coupled off-chip in a non-vertical fashion but may also be vertically coupled to optical fibers in a direction orthogonal to the silicon photonic transmitter chip.

BRIEF DESCRIPTION OF THE DRAWINGS

Embodiments of the photonic integrated circuit with on-chip optical isolator techniques of the present disclosure may overcome these limitations. The techniques will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

In silicon photonics, a laser may be integrated into a photonic integrated circuit (PIC) containing a variety of other components (modulators, splitters, couplers, filters, detectors) on-chip. It is desirable for the laser to be robust against feedback resulting from reflections. Typically, reflections are suppressed using an isolator, which allows light propagation in the forward direction while substantially attenuating light propagation in the reverse direction. If an off-chip isolator is used, the laser is subject to feedback from the on-chip components, including any output coupler. In some situations, it may be preferable to use an on-chip isolator directly downstream from the laser to reduce or eliminate reflections from on and off chip. However, previous on-chip isolators have higher than desirable insertion loss driven mostly by facet loss and propagation loss due to a variety of factors including the type of magneto-optic material used for the isolator, which is typically cerium substituted yttrium iron garnet (Ce:YIG) deposited by sputter epitaxy. Previous on-chip isolators have also been difficult to integrate with photonic process and/or packaging process flows. These issues have presented barriers to commercialization of on-chip optical isolators.

Embodiments of the present disclosure describe photonic integrated circuit (PIC) having an on-chip optical isolator configured to reduce feedback to a laser by suppressing reflections on a photonics device such as a silicon photonics transmitter chip. In various embodiments, the on-chip optical isolator may include a magneto-optic (MO) phase epitaxy grown garnet film, a cladding layer, and/or polarization rotators to rotate light from a laser to be in a transverse magnetic (TM) orientation while it is under the garnet film and back to a transverse electric (TE) orientation when it is no longer under the garnet film. In some embodiments, the garnet film may be coupled with a substrate on a garnet die and the substrate may be thinned to enable subsequent lithography.

In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. It will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

As used herein, the term "module" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable components that provide the described functionality.

Figure 1:
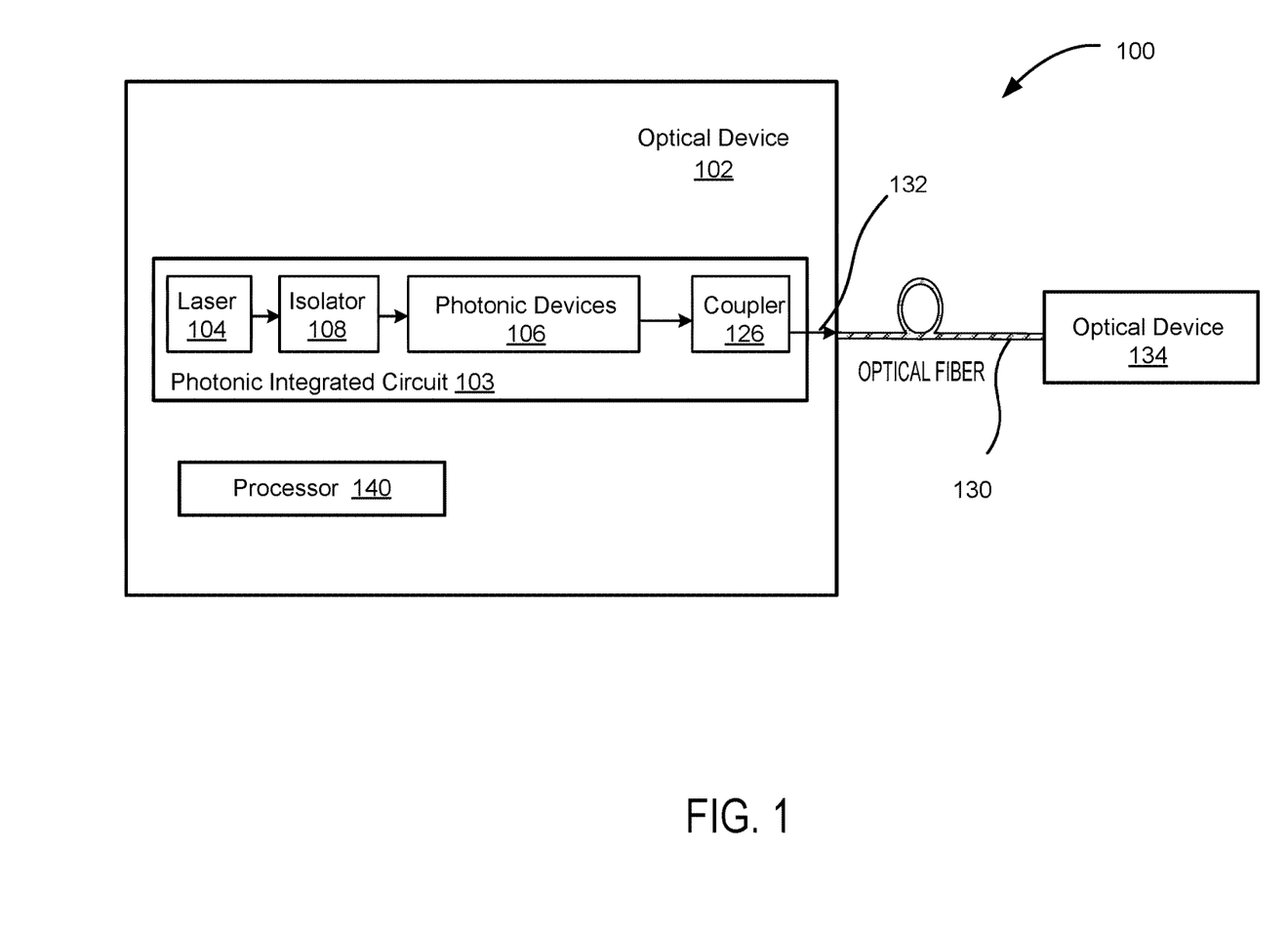
FIG. 1 is a block diagram of an optoelectronic system incorporated with a photonic integrated circuit having an on-chip optical isolator of the present disclosure, according to various embodiments.

FIG. 1 is a block diagram of an optoelectronic system 100 that may include a photonic integrated circuit having an on-chip optical isolator in accordance with some embodiments. The optoelectronic system 100 may be used to transmit an optical signal modulated with a data signal via an optical fiber, for example, between racks in a data center, or long-distance, between data storage facilities, data centers, and the like.

The optoelectronic system 100 may include an optical apparatus (device) 102 having one or more photonic integrated circuits (PICs) 103 with one or more on-chip light sources (e.g., laser devices) 104 to provide a light signal (e.g., constant light intensity signal) to one or more photonic devices 106 on the PIC 103 such as a modulator to modulate input light according to a data signal to be transmitted. One or more on-chip optical isolators 108 may be optically coupled with the on-chip light sources and may suppress reflections back to the light sources 104. In some embodiments, the isolator 108 may include a magneto-optic liquid phase epitaxy grown garnet film. In various embodiments, the isolator 108 may include a cladding layer such as silicon oxide or silicon nitride to minimize reflections at the garnet interfaces. In some embodiments, the isolator 108 may include polarization rotators to rotate light from the light source 104 to be in a transverse magnetic (TM) orientation while it is under the garnet film and back to a transverse electric (TE) orientation when it is no longer under the garnet film. In some embodiments, the garnet may be thinned to enable subsequent lithography.

In various embodiments, the light source 104 may be a hybrid laser that emits light at a wavelength of approximately 1310 nanometers (nm). In some embodiments, the light source 104 may emit light at a different wavelength such as 1550 nm, for example. An optical coupler 126 may be a component of or coupled with the PIC 103. The optical coupler 126 may provide an interface to an optical communication channel (e.g., optical fiber cable or other configuration that may include coupling optics followed by fiber) 130 and may be configured to transfer an optical signal 132 to the optical communication channel 130 to be received by another optical device 134. In various embodiments, the optical apparatus 102 may include a processor 140 that may be coupled with one or more components of the PIC 103. In some embodiments, the processor 140 may be coupled with a modulator included in the photonic devices 106. In embodiments, the modulator may modulate a light signal from the light source 104 for transmission over the optical communication channel 130 based at least in part on a signal from the processor 140. In some embodiments, the processor 140 may include one or more modules to generate control signals for the light source 104 and/or one or more of the photonic components included in the photonic devices 106. The photonic devices 106 may include photonic components such as modulators, splitters, couplers, filters, detectors, phase shifters, polarization rotators, multiplexers, and/or other passive or active optical elements in various embodiments. In some embodiments, multiple light signals may be multiplexed or otherwise coupled with the optical communication channel 130.

Figure 2:
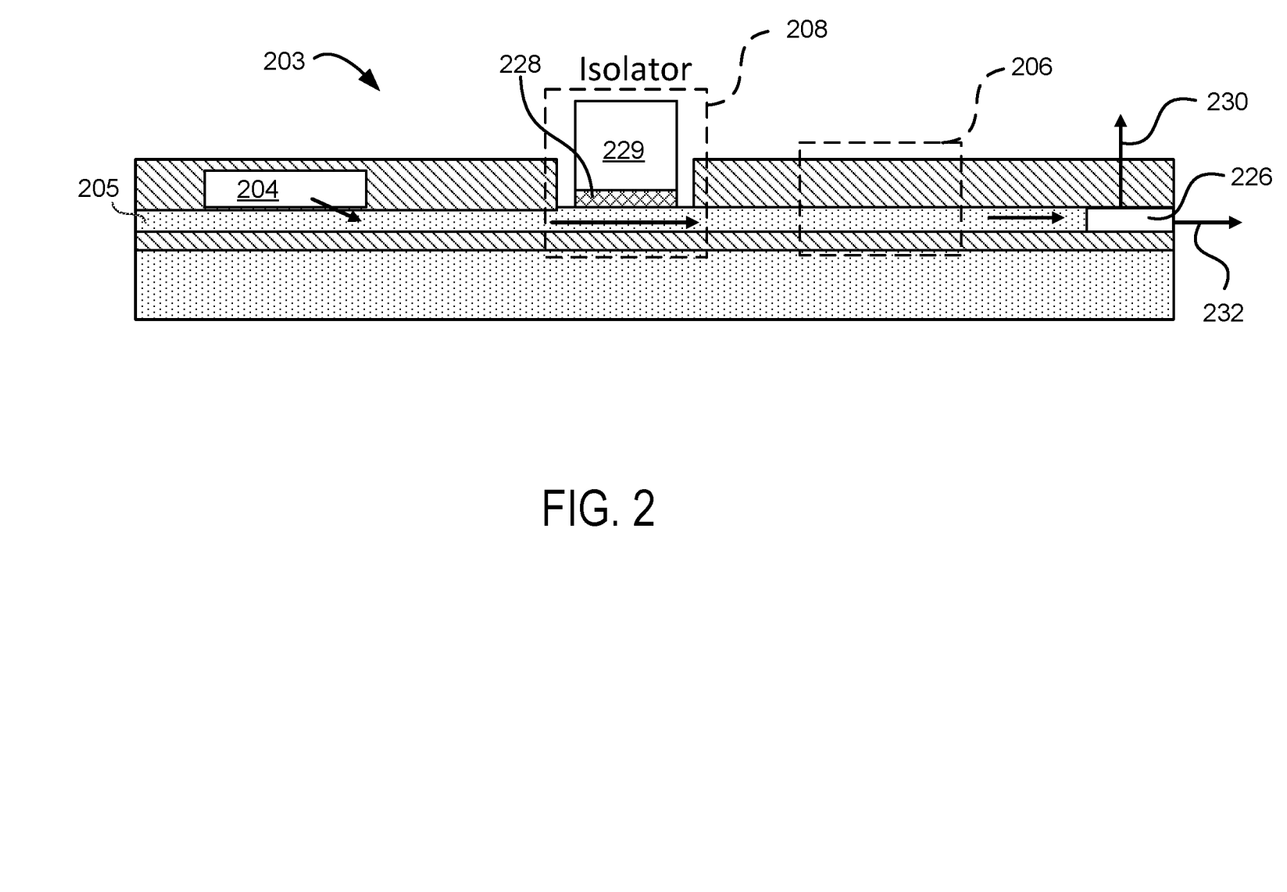
FIG. 2 schematically illustrates a cross-sectional side view of a photonic integrated circuit having an on-chip optical isolator, according to some embodiments.

FIG. 2 schematically illustrates a cross-sectional side view of a photonic integrated circuit (PIC) 203 having a laser 204 that may direct light to a waveguide 205. In various embodiments, the PIC 203 may be an implementation of the PIC 103 described with respect to FIG. 1. Photonic devices 206, details not shown for clarity, may be included on the PIC 203 in various embodiments. An on-chip optical isolator 208 may suppress reflections of light passing through the waveguide 205 back to the laser 204. In various embodiments, the optical isolator 208 may include a garnet die having a MO liquid phase epitaxy grown garnet film 228 and a lattice matched substrate 229. The photonic devices 206 may include photonic components such as modulators, splitters, couplers, filters, detectors, phase shifters, polarization rotators, multiplexers, and/or other passive or active optical elements in various embodiments. An optical coupler 226 may couple light from the PIC 203 to provide off-chip light transmission. In some embodiments, the optical coupler 226 may couple the light in a first direction 230 orthogonal to a plane of the PIC 203 or in a second direction 232. In various embodiments, one or more components of the PIC 203 may be implemented on a photonics chip such as a silicon or SOI chip. In various embodiments, the PIC 203 may include a silicon waveguide and/or other components formed of SOI, an optical nitride such as silicon nitride or aluminum nitride, indium phosphide or other type III-V materials, gallium nitride, tantalum oxide, or germanium for example.

Figure 3:
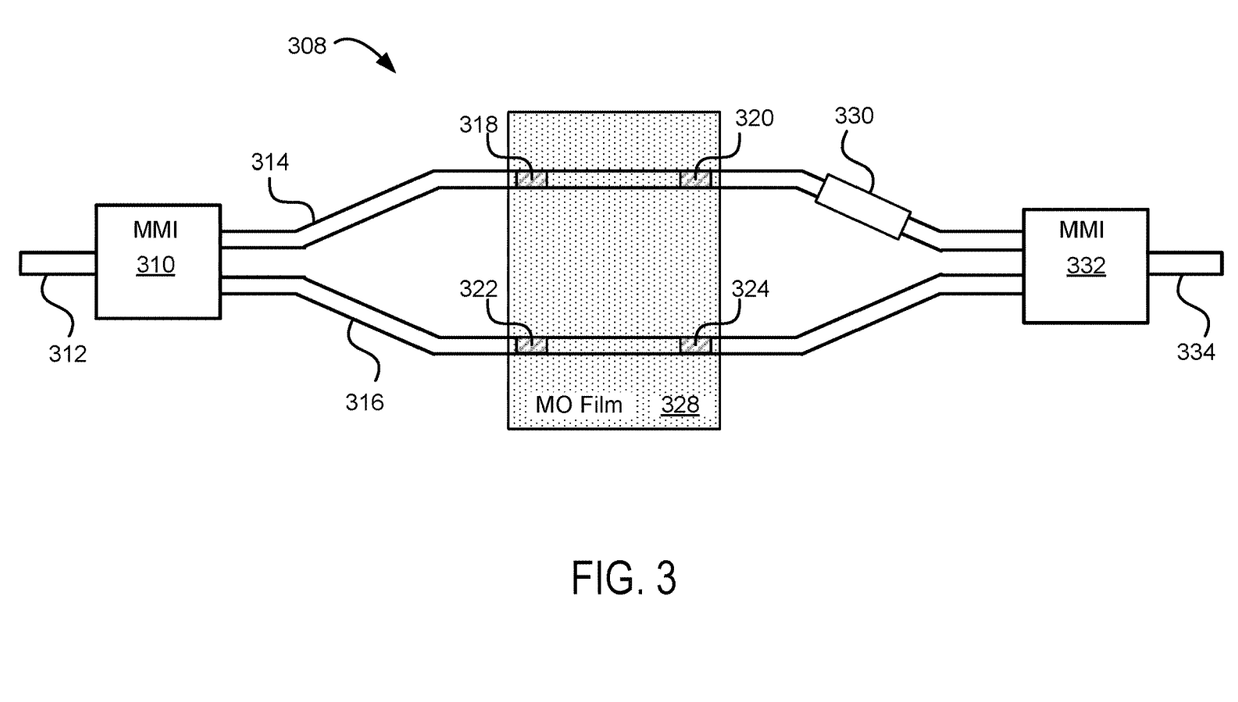
FIG. 3 is a diagram of an optical device showing additional detail for an on-chip optical isolator, according to various embodiments.

FIG. 3 is a diagram of an optical device showing additional detail for an on-chip optical isolator 308, according to various embodiments. In some embodiments, the on-chip optical isolator 308 may correspond to the optical isolator 108 described with respect to FIG. 1 or the optical isolator 208 described with respect to FIG. 2. In embodiments, the optical isolator 308 may be structured in a Mach-Zehnder interferometer (MZI) configuration. A first splitter 310 may receive light from a laser such as the light source 104 or laser 204 in a waveguide 312. The first splitter 310 may split light from the waveguide 312 into a first isolator waveguide 314 and a second isolator waveguide 316.

In embodiments, the silicon photonic circuit components on a PIC other than the isolator may use transverse electric (TE) polarization. In some embodiments, transverse magnetic (TM) polarization may be used to achieve a significant overlap between the optical mode and the garnet film. In some embodiments, the first isolator waveguide 314 may include a first polarization rotator 318 and a second polarization rotator 320. The second isolator waveguide 316 may include a third polarization rotator 322 and a fourth polarization rotator 324. In some embodiments, the isolator 308 may include a magneto-optic liquid phase epitaxy grown garnet film 328. The garnet film 328 may be adjacent to the first isolator waveguide 314 and the second isolator waveguide 316, and may extend over the polarization rotators 318, 320, 322, and 324 in various embodiments. In various embodiments, the width of the first isolator waveguide 314 and the second isolator waveguide 316 may be between greater than or equal to 220 nm and less than or equal to 300 nm in the section of the waveguides that passes under the garnet film 328. In some embodiments, the polarization rotators 318, 320, 322, and 324 may rotate light to be in a TM orientation while it is under the garnet film 328 and back to a TE orientation when it is no longer under the garnet film 328. The optical isolator 308 may include a reciprocal phase shifter, such as π/2 reciprocal phase shifter 330, along one of the first or second isolator waveguides, such as the first isolator waveguide 314, as shown. A second splitter 332 may be coupled with the first isolator waveguide 314 and the second isolator waveguide 316 and may provide an output at an isolator output waveguide 334 that may be coupled with additional photonic components such as the photonic devices 106 or the photonic devices 206. In embodiments, the first splitter 310 and/or the second splitter 332 may be a multi-mode interference (MMI) device.

In various embodiments, a magnetic field may saturate the garnet film 328 and may be applied externally with an external source (not shown) such as a permanent magnet or inductive coil, or the garnet film 328 may have an intrinsic magnetization. The optical isolator 308 may use non-reciprocal phase shift (NRPS) generated by the garnet film 328. In embodiments, light propagating in forward and backward directions may experience opposite phase shifts, enabling constructive interference in the forward direction and destructive interference in the backward direction, thereby preventing light from propagating back into a laser cavity. In some embodiments, the light may experience a phase shift of approximately 45 degrees in one direction and approximately negative 45 degrees in the opposite direction in each waveguide adjacent to the MO garnet film. In various embodiments, the evanescent tail of the optical field with the waveguide may interact with the MO garnet film 328, producing sufficient NRPS to achieve fully destructive interference in the MZI.

FIGS. 4A to 4D schematically illustrate a cross-sectional side view of a PIC 403 having an on-chip optical isolator 408 at various stages of formation, according to some embodiments. In various embodiments, the PIC 403 may correspond to the PIC 103 described with respect to FIG. 1 or the PIC 203 described with respect to FIG. 2. In some embodiments, the isolator 408 may correspond to the isolator 108, the isolator 208, or the isolator 308 described with respect to FIGS. 1-3. FIGS. 4A to 4D are described more fully in the description relating to FIG. 6.

Figure 4A:
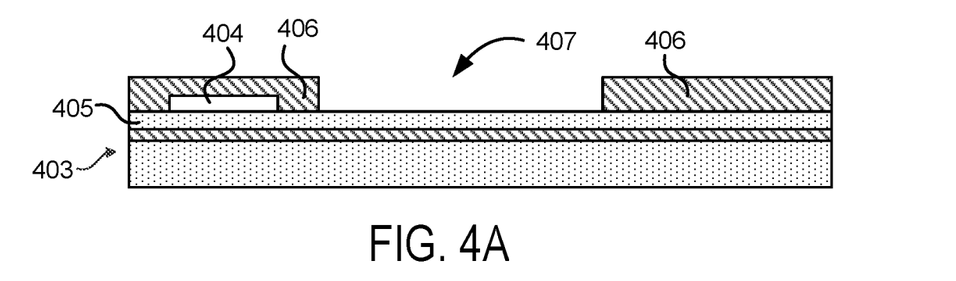
FIGS. 4A to 4D schematically illustrate a cross-sectional side view of a photonic integrated circuit having an on-chip optical isolator at various stages of formation, according to some embodiments.
Figure 4B:
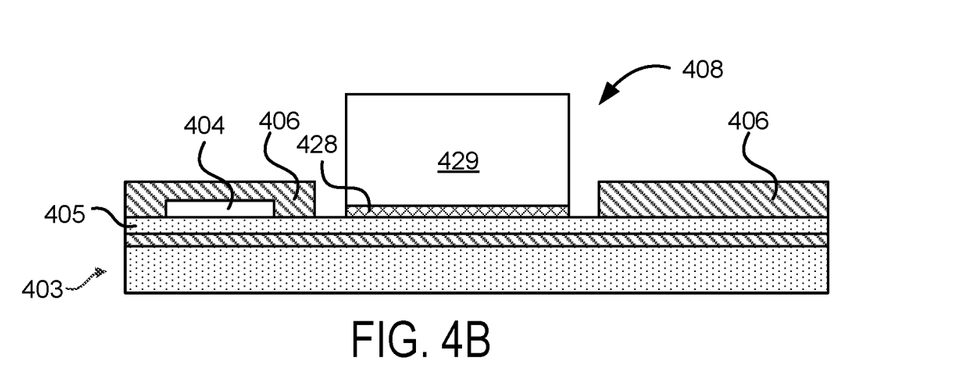
Figure 4C:
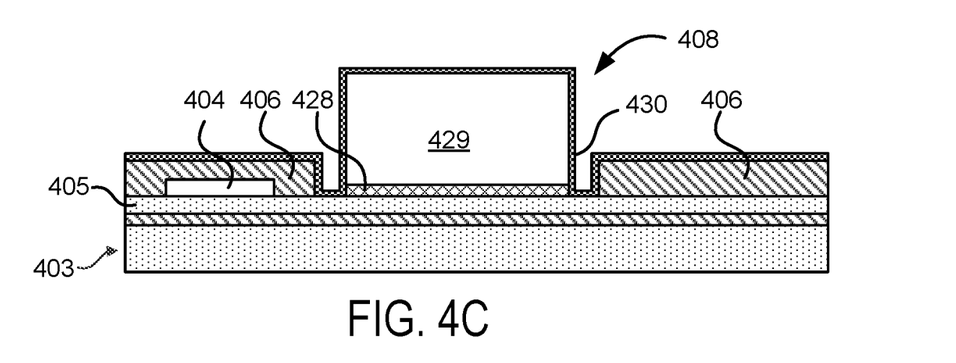
Figure 4D:
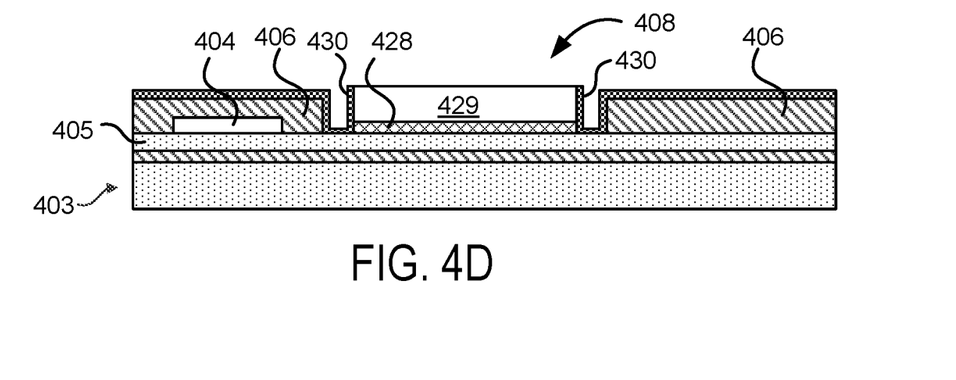
Figure 5:
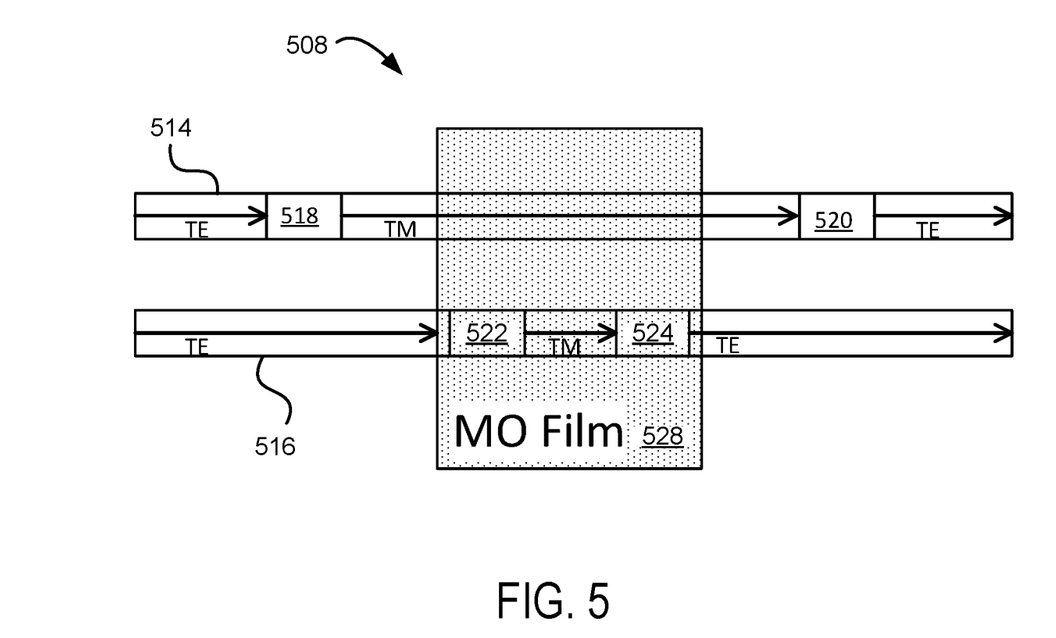
FIG. 5 shows additional detail of a portion of an on-chip optical isolator, including positioning of polarization rotators, according to various embodiments.

FIG. 5 shows additional detail of a portion of an on-chip optical isolator 508, including positioning of polarization rotators, according to various embodiments. The optical isolator 508 may correspond to the optical isolator 108 described with respect to FIG. 1, the optical isolator 208 described with respect to FIG. 2, the optical isolator 308 described with respect to FIG. 3, or the optical isolator 408 described with respect to FIGS. 4A-4D in various embodiments. In various embodiments, the optical isolator 508 may include a first waveguide 514 and a second waveguide 516. The first waveguide 514 may include a first polarization rotator (PR) 518 and a second PR 520. The second waveguide 516 may include a third PR 522 and a fourth PR 524. A magneto-optic garnet film 528 may be adjacent to and/or coupled with the first waveguide 514 and the second waveguide 516. In various embodiments, the garnet film 528 may cover the polarization rotators in one or more waveguides of an optical isolator such as in the manner shown with respect to the second waveguide 516 and the waveguides of the isolator 308 described with respect to FIG. 3. In some embodiments, the polarization rotators may not be covered by the garnet film 528 in one or more waveguides of an optical isolator such as in the manner shown with respect to the first waveguide 514.

Generally, light from a laser such as the light source 104, laser 204, or laser 404 may enter one or more waveguides of an optical isolator such as the optical isolator 108, 208, 308, 408, or 508 in a transverse electric (TE) mode. In various embodiments, a first set of polarization rotators such as the polarization rotators 518 and 522 may rotate the polarization of the light in the waveguide such that it is in a transverse magnetic (TM) mode as it passes by some or all of the magneto-optic garnet film such as the garnet film 228, 328, 428, or 528. In some embodiments, a second set of polarization rotators such as the polarization rotators 520 and 524 may rotate the polarization of the light back to TE mode from TM mode. There may be a substantial component of TM light above the waveguide, resulting in strong reflections at the entry and exit of the garnet region if the light is in TM mode at the garnet interface. In various embodiments, it may be preferred to allow for TE polarization at the garnet interface crossings to reduce this reflection by positioning the polarization rotators under the garnet film as shown with respect to the second waveguide 516 and in the optical isolator 308 of FIG. 3.

Figure 6:
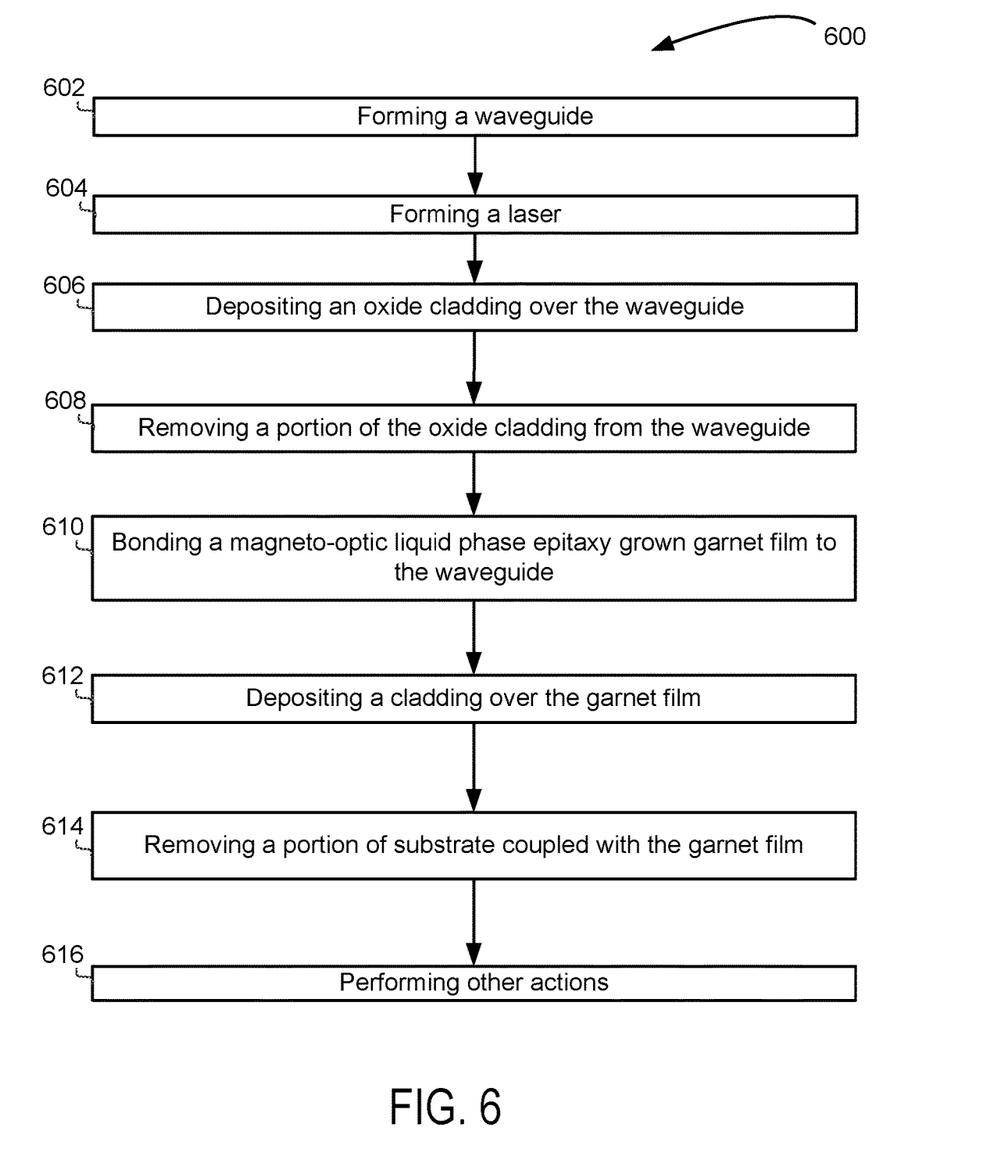
FIG. 6 is a flow diagram illustrating a method of fabricating a photonic integrated circuit including an on-chip optical isolator, according to various embodiments.

FIG. 6 is a flow diagram illustrating a method 600 of fabricating a photonic integrated circuit including an on-chip optical isolator, according to various embodiments. In embodiments, the method 600 may be practiced to fabricate a PIC such as the PIC 103 described with respect to FIG. 1, the PIC 203 described with respect to FIG. 2, the on-chip optical isolator 308 described with respect to FIG. 3, the PIC 403 described with respect to FIGS. 4A-4D, and/or elements of an on-chip optical isolator such as those described with respect to FIG. 5. In embodiments, the PIC may be formed on a SOI wafer with a silicon substrate, an insulating layer, and a silicon layer such as the layers below layer 405 shown in FIGS. 4A-4D.

At a block 602, the method 600 may include forming at least one waveguide of a PIC such as the PIC 403 shown in FIGS. 4A-4D. In embodiments, forming the at least one waveguide may include forming one or more waveguides in a waveguide layer of the PIC. In various embodiments, the waveguides may include a waveguide such as the waveguides 205, 312, 314, 316, 334, 405, 514, and/or 516. In some embodiments, one or more of the waveguides may be formed in a waveguide layer. In embodiments, one or more polarization rotators may be formed in at least one waveguide, such as the polarization rotators 318, 320, 322, and 324 described with respect to FIG. 3. In some embodiments, the waveguides may be formed in a silicon layer of a SOI wafer.

At a block 604, the method 600 may include forming a laser on the PIC. In some embodiments, the laser may be a hybrid laser such as the light source 104 described with respect to FIG. 1, the laser 204 described with respect to FIG. 2, or the laser 404 described with respect to FIG. 4. In various embodiments, a photonic wafer that may be a silicon photonic wafer, a SOI wafer, or another wafer type may be partially or fully fabricated at one or more of the blocks 602 and 604, including waveguides, lasers, modulators, multiplexers, and/or other optical components. In some embodiments, at a block 606, an oxide cladding, such as the oxide cladding 406 shown in FIGS. 4A-4D may be deposited over the waveguide formed at the block 602 and/or the laser formed at the block 604. FIGS. 4A-4D show PIC 403 after removal of a portion of the oxide cladding 406 from above the waveguide 405.

At a block 608, the method 600 may include removing a portion of the oxide cladding formed at the block 606 from a waveguide in a section of the waveguide following the laser formed at the block 604. In embodiments, the oxide cladding may be removed in an isolator region, exposing the silicon. In some embodiments, the oxide cladding removed may correspond to a portion of the original oxide cladding layer 406. The oxide cladding may be removed from above a section 407 of the waveguide 405 as shown in FIG. 4A in various embodiments. In some embodiments, the oxide cladding may be removed with a dry etch process, a wet etch process, or other technique.

At a block 610, the method 600 may include bonding a magneto-optic (MO) liquid phase epitaxy grown garnet film to the waveguide in the process of forming an optical isolator such as an optical isolator 408 shown in FIGS. 4B-4D. In various embodiments, the garnet film may form part of an optical isolator such as the optical isolator 108, 208, 308, or 508. In some embodiments, the magneto-optic garnet film may correspond to garnet film 228, 328, 428, and/or 528. Before bonding to the PIC, the MO garnet film may be on a garnet die that includes a lattice matched substrate in various embodiments. The substrate may correspond to the substrate 229 or substrate 429 shown in FIGS. 4B-4D in some embodiments. In various embodiments, the garnet die may be flip bonded face down to waveguide 405 such that the MO film material is in direct contact with the silicon waveguides in the isolator region. In some embodiments, the garnet die may be bonded using plasma activation (hydrophilic) bonding, high-vacuum (room temperature hydrophobic) bonding, adhesive bonding, solder or eutectic metal bonding with the metal outside the waveguide region, or some other bonding technique.

In various embodiments, the garnet film may be formed of a material from a rare-earth garnet family and may have a high Faraday rotation and low optical loss to produce a relatively high NRPS over a relatively short length. In some embodiments, the garnet film may include a rare-earth iron garnet (RIG) material (e.g., $R_3Fe_5O_{12}$), a rare-earth gallium garnet (RGG) material (e.g., $R_3Ga_5O_{12}$), or a rare-earth aluminum garnet (RAG) material (e.g., $R_3Al_5O_{12}$). In various embodiments, the garnet film may include a wide variety of elements such as Bismuth (Bi), Lutetium (Lu), Holmium (Ho), Gadolinium (Gd), Yttrium (Y), or others selected based at least in part on Faraday rotation, magnetization, or other physical properties. In some embodiments, the MO material may be grown as a single crystal on a lattice-matched substrate using liquid phase epitaxy (LPE), although other growth or deposition methods may be used. In various embodiments, a bismuth iron garnet (BIG) based material grown by LPE on a gadolinium gallium garnet (GGG) substrate, or a variant that may include elements such as Lu, Gd, Ga, Ho, Al, or others may be used. In some embodiments, the substrate may also have additional elements such as Europium (Eu) to more closely match a lattice constant of a desired MO film. In some embodiments, the waveguide may be a silicon waveguide and the MO garnet film may be bonded directly to a silicon surface of the waveguide such as by using a plasma-activated or other bonding process between the MO garnet film and the silicon.

At a block 612, the method 600 may include depositing a cladding over the garnet film. In various embodiments, the cladding may be a cladding such as cladding 430 shown in FIGS. 4C-4D, or another cladding material. The cladding may be formed of a material such as silicon dioxide, silicon nitride, an oxynitride, or another cladding material in various embodiments. In some embodiments, the cladding may reduce reflections that may otherwise occur at an interface of one or more edges of the garnet film and the waveguide by reducing an index of refraction difference where the waveguide passed into and out of the garnet-clad region, thus reducing reflections and optical loss. In some embodiments, modeling evidence suggests that facet loss may be reduced from an approximate 7 dB literature value to approximately a few tenths of dB by positioning polarization rotators as described with respect to FIG. 3 and adding cladding as described with respect to the block 612.

At a block 614, the method 600 may include removing at least a portion of substrate 429 coupled with the garnet film. In various embodiments, the portion of the substrate may be removed with a technique such as grinding, polishing, wet/dry etching, or some other technique. In some embodiments, a portion of the cladding may also be removed. In various embodiments, the substrate may have a thickness of approximately 500 microns before the removal process and may have a thickness greater than or equal to 5 microns and less than or equal to 50 microns after the removal process. In some embodiments, the substrate may have a thickness of approximately 30 microns after the removal process. Following removal of substrate material, the PIC may appear similar to the PIC 403 shown in FIG. 4D where a height of the garnet die of isolator 408 is shown to be reduced in comparison to its height in FIG. 4C. In various embodiments, the cladding material deposited at the block 612, while removed from the top of the garnet die, may still be present at the edges of the garnet film 428 and/or between the garnet die and the oxide cladding 406 such that the waveguide 405 is covered by the cladding 430 in this region rather than being exposed to air. In some embodiments, the cladding deposited at the block 612 may be deposited after rather than before removal of substrate at the block 614.

At a block 616, the method 600 may further include performing other actions such as performing additional lithographic techniques, forming conductive regions on the PIC, and/or packaging the PIC, for example.

Figure 7:
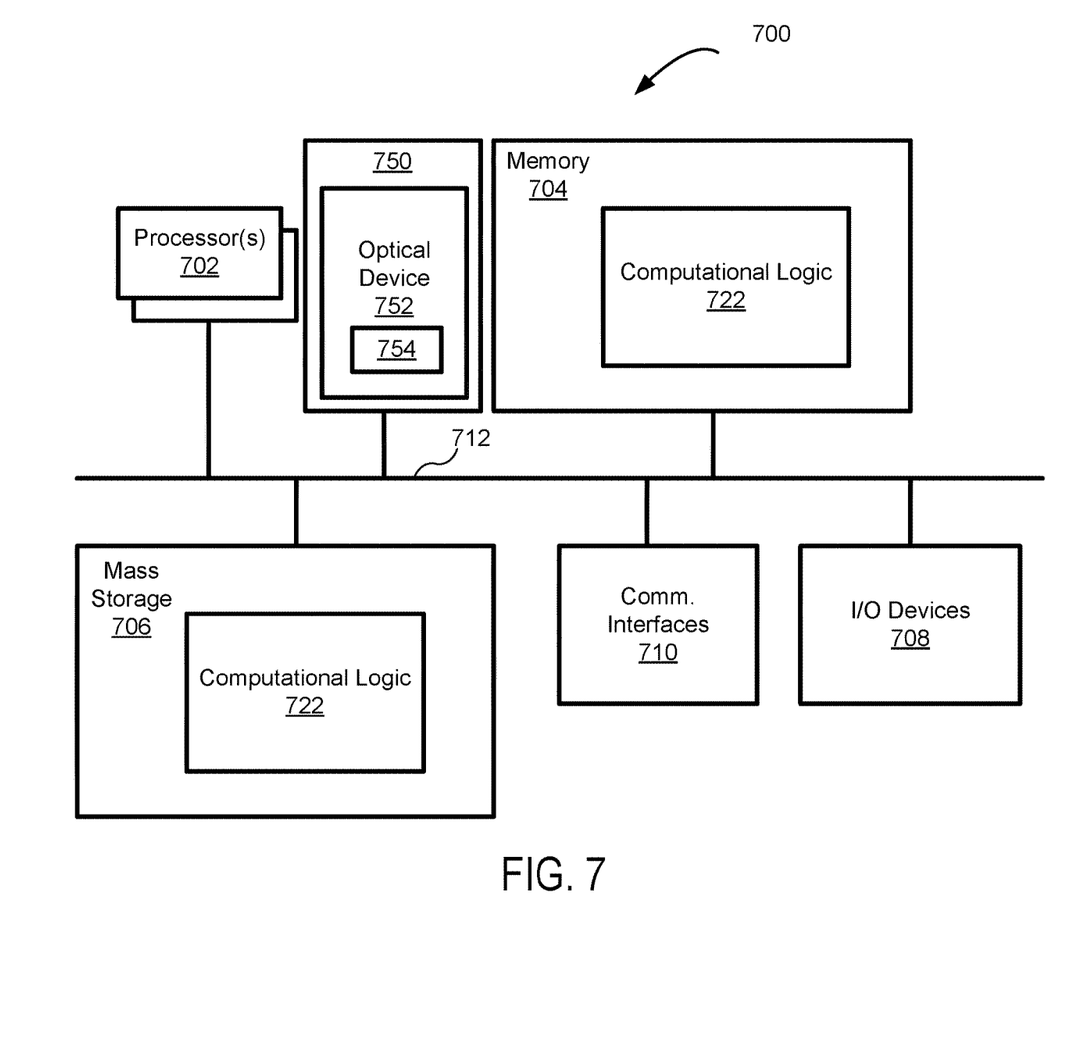
FIG. 7 schematically illustrates an example computing device and an optical device with an on-chip optical isolator, according to various embodiments.

FIG. 7 illustrates an example computing device 700 suitable for use with various components and methods of FIGS. 1-6, such as optoelectronic system 100 including optical device 102 with PIC 103 and optical isolator 108 described with respect to FIG. 1, PIC 203 and optical isolator 208 described with respect to FIG. 2, optical isolator 308 described with respect to FIG. 3, PIC 403 and optical isolator 408 described with respect to FIG. 4, optical isolator 508 described with respect to FIG. 5, and/or the PIC and optical isolator formed in accordance with the method 600 described with respect to FIG. 6, in accordance with various embodiments. As shown, computing device 700 may include one or more processors or processor cores 702 and system memory 704. For the purpose of this application, including the claims, the terms "processor" and "processor cores" may be considered synonymous, unless the context clearly requires otherwise. The processor 702 may include any type of processors, such as a central processing unit (CPU), a microprocessor, and the like. The processor 702 may be implemented as an integrated circuit having multi-cores, e.g., a multi-core microprocessor. The computing device 700 may include mass storage devices 706 (such as diskette, hard drive, volatile memory (e.g., dynamic random-access memory (DRAM), compact disc read-only memory (CD-ROM), digital versatile disk (DVD), and so forth). In general, system memory 704 and/or mass storage devices 706 may be temporal and/or persistent storage of any type, including, but not limited to, volatile and non-volatile memory, optical, magnetic, and/or solid state mass storage, and so forth. Volatile memory may include, but is not limited to, static and/or dynamic random access memory. Non-volatile memory may include, but is not limited to, electrically erasable programmable read-only memory, phase change memory, resistive memory, and so forth.

The computing device 700 may further include input/output devices 708 (such as a display (e.g., a touchscreen display), keyboard, cursor control, remote control, gaming controller, image capture device, and so forth) and communication interfaces 710 (such as network interface cards, modems, infrared receivers, radio receivers (e.g., Bluetooth), and so forth). The computing device 700 may include an optoelectronic system 750 that may include an optical device 752 with a PIC 754 having an on-chip optical isolator. In various embodiments, the optoelectronic system may be configured similarly to the optoelectronic system 100, the optical device 752 may be configured similarly to the optical apparatus 102 and/or the PIC 754 may be configured similarly to the PIC 103, PIC 203, or PIC 403 and/or may include an on-chip optical isolator configured similarly to the optical isolator 108, 208, 308, 408, and/or 508.

The communication interfaces 710 may include communication chips (not shown) that may be configured to operate the device 700 in accordance with a Global System for Mobile Communication (GSM), General Packet Radio Service (GPRS), Universal Mobile Telecommunications System (UMTS), High Speed Packet Access (HSPA), Evolved HSPA (E-HSPA), or Long-Term Evolution (LTE) network. The communication chips may also be configured to operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chips may be configured to operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication interfaces 710 may operate in accordance with other wireless protocols in other embodiments.

The above-described computing device 700 elements may be coupled to each other via system bus 712, which may represent one or more buses. In the case of multiple buses, they may be bridged by one or more bus bridges (not shown). Each of these elements may perform its conventional functions known in the art. In particular, system memory 704 and mass storage devices 706 may be employed to store a working copy and a permanent copy of the programming instructions, such as drivers, for the operation of various components of computer system 700, including but not limited to the operation of the optical device 102 of FIG. 1, the PIC 203 of FIG. 2, the PIC 403 or FIG. 4, an operating system of computer system 700, and/or one or more applications, collectively referred to as computational logic 722. The various elements may be implemented by assembler instructions supported by processor(s) 702 or high-level languages that may be compiled into such instructions.

The permanent copy of the programming instructions may be placed into mass storage devices 706 in the factory or in the field through, for example, a distribution medium (not shown), such as a compact disc (CD), or through communication interface 710 (from a distribution server (not shown)). That is, one or more distribution media having an implementation of the agent program may be employed to distribute the agent and to program various computing devices.

The number, capability, and/or capacity of the elements 708, 710, 712 may vary, depending on whether computing device 700 is used as a stationary computing device, such as a set-top box or desktop computer, or a mobile computing device, such as a tablet computing device, laptop computer, game console, or smartphone. Their constitutions are otherwise known, and accordingly will not be further described.

For some embodiments, at least one of processors 702 may be packaged together with all or portions of computational logic 722 configured to facilitate aspects of embodiments described herein to form a System in Package (SiP) or a System on Chip (SoC).

The computing device 700 may include or otherwise be associated with an optoelectronic system that may include components and/or implement methods described with respect to FIGS. 1-6, such as optoelectronic system 100, implementing aspects of the optical device 102, including the PIC 103, 203, or 403 or optical isolator 108, 208, 308, 408, or 508 as described above, and in particular the embodiments of the optical isolator described in reference to FIGS. 1-6. In some embodiments, at least some components of the optoelectronic system 100 (e.g., optical device 102) may be communicatively coupled with the computing device 700 and/or be included in one or more of the computing device 700 components, such as communication interfaces 710, for example. In some embodiments, one or more components such as processor 702 may be included as a part of the optoelectronics system 100.

In various implementations, the computing device 700 may comprise one or more components of a data center, a laptop, a netbook, a notebook, an ultrabook, a smartphone, a tablet, a personal digital assistant (PDA), an ultra mobile PC, a mobile phone, or a digital camera. In further implementations, the computing device 700 may be any other electronic device that processes data.

EXAMPLES

Example 1 may include a photonic integrated circuit, comprising: a laser; and an on-chip isolator optically coupled with the laser, wherein the on-chip isolator includes an optical waveguide having a section coupled with a magneto-optic liquid phase epitaxy grown garnet film.

Example 2 may include the subject matter of Example 1, wherein the on-chip isolator further comprises a cladding coupled with the garnet film.

Example 3 may include the subject matter of Example 2, wherein the cladding includes silicon dioxide, silicon oxynitride, or silicon nitride.

Example 4 may include the subject matter of any one of Examples 1-3, wherein the optical waveguide is a first optical waveguide and the on-chip isolator further comprises a second optical waveguide, wherein the garnet film is coupled with both the first and second optical waveguides and the on-chip isolator is arranged in a Mach-Zehnder interferometer configuration.

Example 5 may include the subject matter of Example 4, wherein the on-chip isolator further comprises: a first splitter coupled with the first and second optical waveguides; and a second splitter coupled with the first and second optical waveguides, wherein the garnet film is coupled with a section of the first and second optical waveguides between the first and second splitters.

Example 6 may include the subject matter of any one of Examples 1-5, wherein the garnet film is formed of a material from a rare-earth garnet family.

Example 7 may include the subject matter of Example 1-6, wherein the garnet film includes a rare-earth iron garnet material, a rare-earth gallium garnet material, or a rare-earth aluminum garnet material.

Example 8 may include the subject matter of any one of Examples 1-7, wherein the garnet film includes at least one of Bismuth, Lutetium, Holmium, Gadolinium, or Yttrium.

Example 9 may include the subject matter of any one of Examples 1-8, wherein the optical waveguide has a width of greater than or equal to 220 nanometers and less than or equal to 300 nanometers along the section of the optical waveguide coupled with the garnet film.

Example 10 may include the subject matter of any one of Examples 1-9, wherein the on-chip isolator further comprises: a first polarization rotator; and a second polarization rotator, wherein the first and second polarization rotators are spaced apart along the section of the optical waveguide coupled with the garnet film.

Example 11 may include the subject matter of Example 1, wherein the on-chip isolator further comprises a cladding coupled with the garnet film, wherein: the cladding includes silicon dioxide, silicon oxynitride, or silicon nitride; the garnet film includes a rare-earth iron garnet material, a rare-earth gallium garnet material, or a rare-earth aluminum garnet material; the optical waveguide is a first optical waveguide and the on-chip isolator further comprises a second optical waveguide; the garnet film is coupled with both the first and second optical waveguides; the on-chip isolator is arranged in a Mach-Zehnder interferometer configuration; and the on-chip isolator further comprises at least one polarization rotator in a section of at least one of the first and second optical waveguides coupled with the garnet film.

Example 12 may include a method of fabricating a photonic integrated circuit, comprising: forming a laser; and forming an on-chip isolator, wherein forming an on-chip isolator includes: providing a waveguide; removing an oxide cladding from the waveguide; bonding a magneto-optic garnet film to the waveguide in the region where the oxide cladding was removed; and depositing a cladding over the garnet film.

Example 13 may include the subject matter of Example 12, wherein the garnet film is a liquid phase epitaxy grown garnet film.

Example 14 may include the subject matter of Example 13, wherein the cladding includes silicon dioxide, silicon oxynitride, or silicon nitride.

Example 15 may include the subject matter of any one of Examples 12-14, wherein the garnet film is formed of a material from a rare-earth garnet family.

Example 16 may include the subject matter of any one of Examples 12-15, wherein the garnet film includes a rare-earth iron garnet material, a rare-earth gallium garnet material, or a rare-earth aluminum garnet material.

Example 17 may include the subject matter of any one of Examples 12-16, wherein the garnet film includes at least one of Bismuth, Lutetium, Holmium, Gadolinium, or Yttrium.

Example 18 may include the subject matter of any one of Examples 12-17, wherein a substrate is coupled with the garnet film and the method further comprises removing a portion of the substrate.

Example 19 may include an optical system comprising: a processor; and an optical device coupled with the processor, wherein the optical device includes: a photonic integrated circuit comprising: a laser; and an on-chip isolator optically coupled with the laser, wherein the on-chip isolator includes an optical waveguide having a section coupled with a magneto-optic liquid phase epitaxy grown garnet film.

Example 20 may include the subject matter of Example 19, wherein the on-chip isolator includes a cladding coupled with the garnet film.

Example 21 may include the subject matter of any one of Examples 19-20, wherein the garnet film is formed of a material from a rare-earth garnet family.

Example 22 may include the subject matter of any one of Examples 19-21, wherein the garnet film includes a rare-earth iron garnet material, a rare-earth gallium garnet material, or a rare-earth aluminum garnet material.

Example 23 may include the subject matter of any one of Examples 19-22, wherein the garnet film includes at least one of Bismuth, Lutetium, Holmium, Gadolinium, or Yttrium.

Example 24 may include the subject matter of any one of Examples 19-23, wherein the on-chip isolator includes a first polarization rotator and a second polarization rotator, wherein the first and second polarization rotators are spaced apart along the section of the optical waveguide coupled with the garnet film.

Example 25 may include a photonic integrated circuit, comprising: means for emitting coherent light; and means for optically isolating the means for emitting coherent light coupled with the means for emitting coherent light on-chip, wherein the means for optically isolating the means for emitting coherent light includes an optical waveguide having a section coupled with a magneto-optic liquid phase epitaxy grown garnet film.

Example 26 may include the subject matter of Example 25, wherein the means for optically isolating the means for emitting coherent light further comprises a cladding coupled with the garnet film.

Example 27 may include the subject matter of Example 26, wherein the cladding includes silicon dioxide, silicon oxynitride, or silicon nitride.

Example 28 may include the subject matter of any one of Examples 25-27, wherein the optical waveguide is a first optical waveguide and the means for optically isolating the means for emitting coherent light further comprises a second optical waveguide, wherein the garnet film is coupled with both the first and second optical waveguides and the means for optically isolating the means for emitting coherent light is arranged in a Mach-Zehnder interferometer configuration.

Example 29 may include the subject matter of any one of Examples 25-28, wherein the means for optically isolating the means for emitting coherent light further comprises: a first means for splitting light coupled with the first and second optical waveguides; and a second means for splitting light coupled with the first and second optical waveguides, wherein the garnet film is coupled with a section of the first and second optical waveguides between the first and second means for splitting light.

Example 30 may include the subject matter of any one of Examples 25-29, wherein the garnet film is formed of a material from a rare-earth garnet family.

Example 31 may include the subject matter of any one of Examples 25-30, wherein the garnet film includes a rare-earth iron garnet material, a rare-earth gallium garnet material, or a rare-earth aluminum garnet material.

Example 32 may include the subject matter of any one of Examples 25-31, wherein the garnet film includes at least one of Bismuth, Lutetium, Holmium, Gadolinium, or Yttrium.

Example 33 may include the subject matter of any one of Examples 25-32, wherein the optical waveguide has a width of greater than or equal to 220 nanometers and less than or equal to 300 nanometers along the section of the optical waveguide coupled with the garnet film.

Example 34 may include the subject matter of any one of Examples 25-33, wherein the means for optically isolating the means for emitting coherent light further comprises: a first means for rotating a polarization of light; and a second means for rotating a polarization of light, wherein the first and second means for rotating a polarization of light are spaced apart along the section of the optical waveguide coupled with the garnet film.

Example 35 may include the subject matter of Example 25, wherein the means for optically isolating the means for emitting coherent light further comprises a cladding coupled with the garnet film, wherein: the cladding includes silicon dioxide, silicon oxynitride, or silicon nitride; the garnet film includes a rare-earth iron garnet material, a rare-earth gallium garnet material, or a rare-earth aluminum garnet material; the optical waveguide is a first optical waveguide and the means for optically isolating the means for emitting coherent light further comprises a second optical waveguide; the garnet film is coupled with both the first and second optical waveguides; the means for optically isolating the means for emitting coherent light is arranged in a Mach-Zehnder interferometer configuration; and the means for optically isolating the means for emitting coherent light further comprises at least one means for rotating a polarization of light in a section of at least one of the first and second optical waveguides coupled with the garnet film.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

What is claimed is:

1. A photonic integrated circuit, comprising:
    an on-chip laser over an optical waveguide on a chip; and
    an on-chip isolator on the chip, to receive an output of the on-chip laser, wherein the on-chip isolator includes the optical waveguide, a magneto-optic liquid phase epitaxy grown garnet film on the optical waveguide, and a lattice matched substrate on the garnet film, wherein a first portion of the optical waveguide extends from the on-chip laser to the garnet film, and wherein a second portion of the optical waveguide and the on-chip laser are covered by a cladding, the isolator is within an opening of the cladding, and the garnet film of the isolator is below a top surface of the cladding.

2. The photonic integrated circuit of claim 1, wherein the cladding is coupled with the garnet film.

3. The photonic integrated circuit of claim 2, wherein the cladding includes silicon oxynitride or silicon nitride.

4. The photonic integrated circuit of claim 1, wherein the optical waveguide is a first optical waveguide and the on-chip isolator further comprises a second optical waveguide, wherein the garnet film is coupled with both the first and second optical waveguides and the on-chip isolator is arranged in a Mach-Zehnder interferometer configuration.

5. The photonic integrated circuit of claim 4, wherein the on-chip isolator further comprises:
    a first splitter coupled with the first and second optical waveguides; and
    a second splitter coupled with the first and second optical waveguides, wherein the garnet film is coupled with a section of the first and second optical waveguides between the first and second splitters.

6. The photonic integrated circuit of claim 1, wherein the garnet film is formed of a material from a rare-earth garnet family.

7. The photonic integrated circuit of claim 6, wherein the garnet film includes a rare-earth iron garnet material, a rare-earth gallium garnet material, or a rare-earth aluminum garnet material.

8. The photonic integrated circuit of claim 7, wherein the garnet film includes at least one of Bismuth, Lutetium, Holmium, Gadolinium, or Yttrium.

9. The photonic integrated circuit of claim 1, wherein the optical waveguide has a width of greater than or equal to 220 nanometers and less than or equal to 300 nanometers along the section of the optical waveguide coupled with the garnet film, wherein the section extends along the entire length of the optical waveguide coupled with the garnet film.

10. The photonic integrated circuit of claim 1, wherein the on-chip isolator further comprises:
    a first polarization rotator; and
    a second polarization rotator, wherein the first and second polarization rotators are spaced apart along the section of the optical waveguide coupled with the garnet film.

11. The photonic integrated circuit of claim 1, wherein the on-chip isolator further comprises a cladding coupled with the garnet film, wherein:
    the cladding includes silicon dioxide, silicon oxynitride, or silicon nitride;

the garnet film includes a rare-earth iron garnet material, a rare-earth gallium garnet material, or a rare-earth aluminum garnet material;

the optical waveguide is a first optical waveguide and the on-chip isolator further comprises a second optical waveguide;

the garnet film is coupled with both the first and second optical waveguides;

the on-chip isolator is arranged in a Mach-Zehnder interferometer configuration; and the on-chip isolator further comprises at least one polarization rotator in a section of at least one of the first and second optical waveguides coupled with the garnet film.

12. The photonic integrated circuit of claim 1, wherein the chip is a photonic wafer.

13. The photonic integrated circuit of claim 12, wherein the photonic wafer is a silicon photonic wafer or a silicon on insulator (SOI) wafer.

14. The photonic integrated circuit of claim 13, wherein the photonic wafer is the SOI wafer and the optical waveguide is in a silicon layer of the SOI wafer.

* * * * *